United States Patent [19]

Wu

[11] Patent Number: 5,463,386

[45] Date of Patent: Oct. 31, 1995

[54] ELECTRICAL MATRIX KEYBOARD SCANNING CIRCUIT

[75] Inventor: Chyi-Chang Wu, Hsinchu, Taiwan

[73] Assignee: United Microelectronics Corp., Hsinchu, Taiwan

[21] Appl. No.: 212,343

[22] Filed: Mar. 11, 1994

[51] Int. Cl.$^6$ .......................... H03K 17/94; H03M 11/00
[52] U.S. Cl. ................. 341/26; 341/22; 341/24
[58] Field of Search .................. 341/22, 26, 24, 341/25; 379/368, 393

[56] References Cited

U.S. PATENT DOCUMENTS

| | | | |
|---|---|---|---|
| 4,266,278 | 5/1981 | Ebihara et al. | 341/26 |
| 5,036,320 | 7/1991 | Wroblewski | 341/22 |
| 5,285,495 | 2/1994 | Wu et al. | 341/26 |

*Primary Examiner*—John K. Peng
*Assistant Examiner*—Daniel J. Wu
*Attorney, Agent, or Firm*—Ladas & Parry

[57] ABSTRACT

Disclosed is a scanning circuit for an electrical matrix keyboard. The keyboard has extended keys on a voltage line and a ground line. Two extended line detector are incorporated into the circuit for detecting the extended keys without increasing input and output ports of the circuit, so that the circuit can be integrated into a chip at a lower cost.

5 Claims, 6 Drawing Sheets

ELECTRICAL MATRIX KEYBOARD SCANNING CIRCUIT

BACKGROUND OF THE INVENTION

The present invention relates to an electrical matrix keyboard scanning circuit, especially to a scanning circuit for an electrical matrix keyboard having extended keys.

An electrical keyboard is extensively used as an user input interface in computers, telephones, etc. A circuit coupled to the keyboard detects which key is pressed by positive-logic scanning or negative-logic scanning. For instance, as shown in FIG. 1a, the keys of a keyboard are arranged matrix-like, where R1 to R4 correspond row 1 to row 4, and C1 to C4 correspond column 1 to column 4. When a key is pressed, its corresponding row line (e. g. R2) and column line (e. g. C3) are connected. In a negative-logic scanning circuit, row lines are firstly set to high voltage level with high impedance, and column lines are set to low voltage with low impedance. When a row line is connected to a column line, its voltage level will drop to the low level. The states of the row lines are stored in a latch circuit. After that, column lines are set to the high voltage level with high impedance, and row lines are set to the low voltage with low impedance. When the column line is connected to the row line as stated above, its voltage level drops to low level, and the states of the column line are stored in another latch circuit. By reading out the states stored in the latch circuits, the position of the pressed key can be easily determined. The steps described above are typically repeated for several times to confirm that the detected key has been intentionally pressed by user.

The keyboard shown in FIG. 1a is a typical 4×4 matrix keyboard. One of the integrated circuits (ICs) designed for scanning such a keyboard is the UM91230C chip made by United Microelectronics Corp. (UMC), which provides eight pins or ports for scanning, R1 to R4 and C1 to C4. Thus, the keyboard can only have 16 input keys. However, more keys are often required in modern applications, and number of pins for the keyboard scanning circuit IC increases as the number of keys which may be scanned increases. Increasing the number of pins raises the cost of manufacture of the I. C.

SUMMARY OF THE INVENTION

It is therefore an object of the present invention to provide a scanning circuit for keyboards which permits the number of keys to increase without increasing the scanning ports of the keyboard IC.

This object of the present invention are fulfilled by providing a keyboard scanning circuit for an electric matrix keyboard having (1) ordinary keys on the intersection of a first set of ports and a second set of ports, (2) a first set of extended keys on the intersection of the first set of ports and a ground line, and (3) a second set of extended keys on the intersection of the second set of ports and a voltage line. The circuit comprises a scanning circuit for scanning the status of the keys of the keyboard, including a first set of resistors, a first set of MOS transistors of a first type serially coupled with the first set of resistors between a voltage source and said first set of ports respectively, a second set of MOS transistors of the first type coupled between the voltage source and said first set of ports respectively, a second set of resistors, a first set of MOS transistors of a second type serially coupled with the second set of resistors between a ground line and said second set of ports respectively, a second set of MOS transistors of the second type coupled between the ground line and said second set of ports respectively, and a flip-flop for driving the transistors to alternatively set said first set of ports to a high level with a high impedance and said second set of ports to a low level with a low impedance, or said first set of ports to a high level with a low impedance and said second set of ports to a low level with a high impedance; a memory device for storing the status of the keys and outputting corresponding signals when one of said ordinary keys is pressed, including a first set of latches connected to said first set of ports, having inverted outputs, and a second set of latches connected to said second set of ports, having non-inverted outputs; a NOR gate connected to all the inverted outputs of the first set of latches; and a NOR gate connected to all the non-inverted outputs of the second set of latches.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE FIGURES

The present invention will become more fully understood from the detailed description given hereinafter and the accompanying drawings which are given by way of illustration only, and thus are not limitative of the present invention and wherein:

FIG. 1b shows a conventional keyboard IC for use with the keyboard shown in FIG. 1a;

DETAILED DESCRIPTION OF THE EMBODIMENTS

Figure 1A:
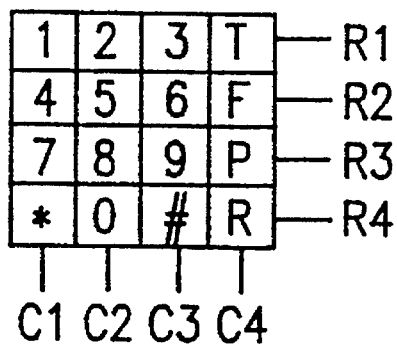
FIG. 1a is a schematic top view showing a typical 4×4 matrix electrical keyboard.
Figure 1B:
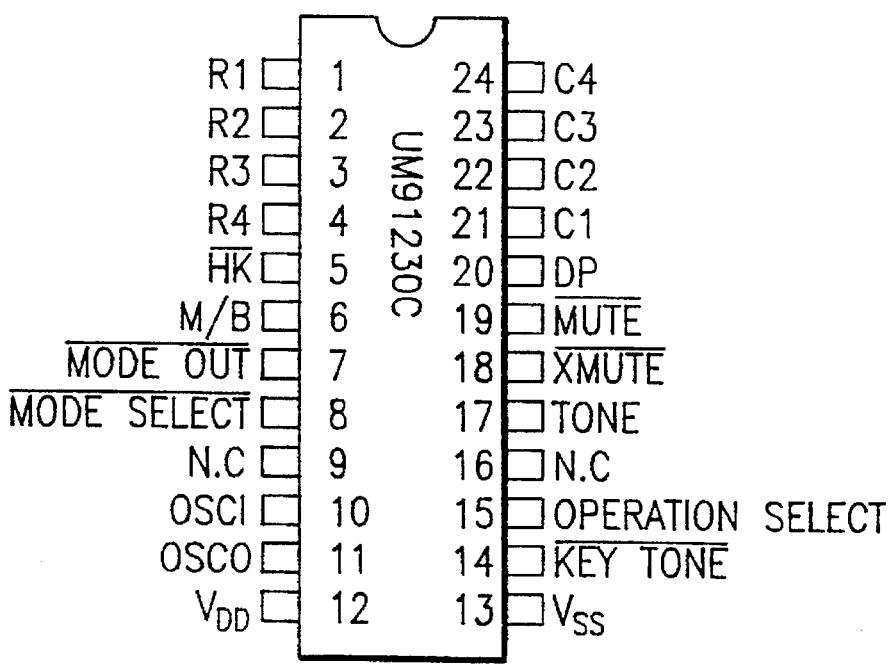
Figure 2A:
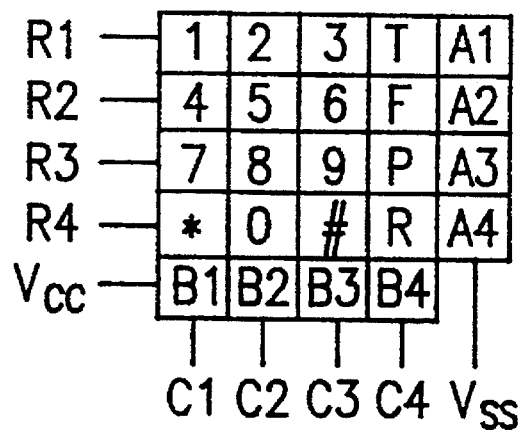
FIG. 2a is a schematic top view showing an extended matrix electrical keyboard according to the present invention.

An extended keyboard modified from the keyboard in FIG. 1a is illustrated in FIG. 2a. A voltage line, Vcc, which is connected to a voltage source, is incorporated to form a new row. A ground line, Vss, which is connected to ground, is incorporated to form a new column. Therefore, eight input keys are added to the keyboard, A1 to A4 and B1 to B4. Or, in other words, the new keyboard has eight keys more than the original keyboard shown in FIG. 1a.

Figure 3:
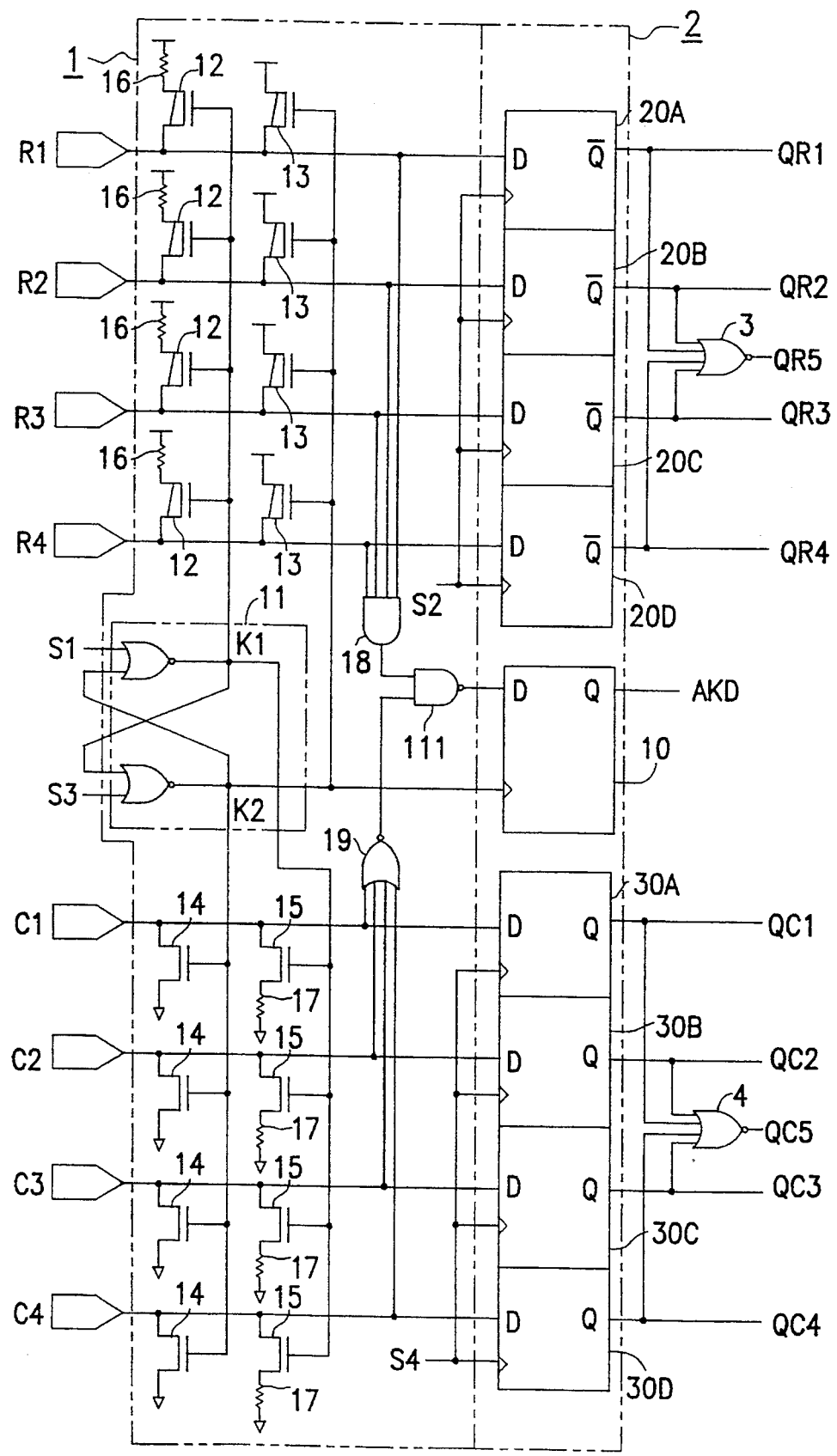
FIG. 3 is a schematic circuit diagram showing a first embodiment of the keyboard scanning circuit for incorporating with the keyboard shown in FIG. 2a according to the present invention.

FIG. 3 shows a first embodiment of a keyboard scanning circuit for operating with the extended keyboard shown in FIG. 2a according to the present invention. The scanning circuit includes a scanning circuit 1 for scanning the status of the keys on the keyboard, memory devices 2 coupled to the scanning circuit 1 for storing the status of the keys, and two extended line detectors 3 and 4 connected to the memory devices 2 for detecting the extended keys (B1–B4) on the voltage line (Vcc) or the extended keys (A1–A4) on the ground line (Vss).

Figure 4:
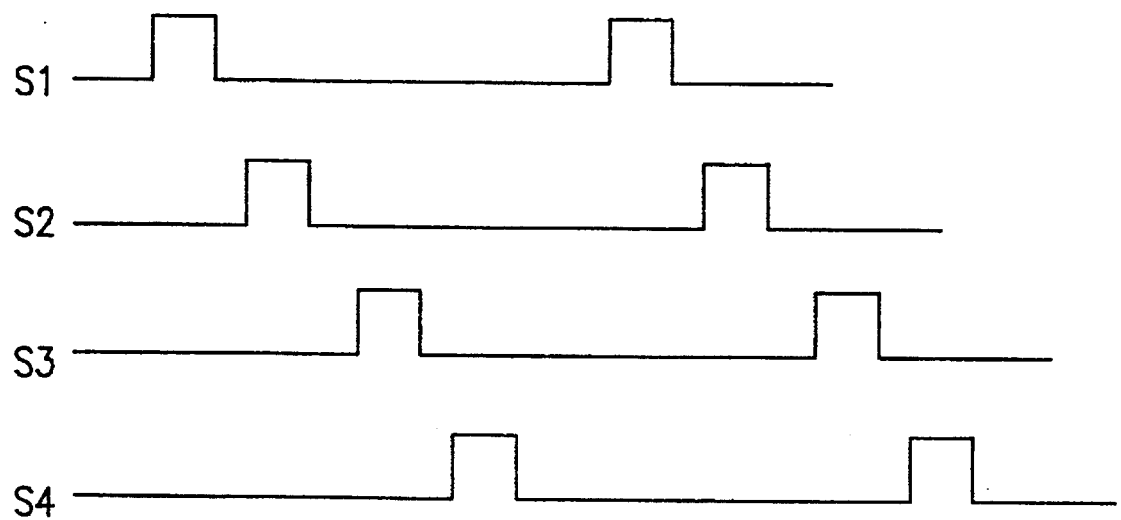
FIG. 4 shows a schematic diagram of a clock generated by a clock generator for keyboard scanning in the circuit shown in FIG. 3.

The circuit is controlled by control clocks S1, S2, S3 and S4 as shown in FIG. 4, which are generated by a clock generator (not shown).

The scanning circuit 1 mainly consists of a flip-flop 11, a plurality of PMOS transistors 12 and 13, a plurality of NMOS transistors 14 and 15, a plurality of resistors 16 and 17, and three logic gates 18, 19, and 111 as shown in FIG. 3. The flip-flop 11 has two inputs connected to clocks S1 and S3 respectively, and two outputs K1 and K2. Four PMOS transistors 12, each serially coupled with a resistor 16, are respectively coupled between the row ports R1 to R4 and the voltage source Vcc, with their gate electrodes connected to K1. Four PMOS transistors 13 are respectively coupled between four row ports R1 to R4 and the voltage source Vcc directly, with their gate electrodes connected to K2. AND gate 18 has four inputs connected to four row ports R1 to R4 respectively, with its output connected to one of the input of NAND gate 111. In a similar way, with some differences, four NMOS transistors 14 are respectively coupled between four column ports C1 to C4 and the ground Vss directly, with their gate electrodes connected to K2. Four NMOS transistors 15, each serially coupled with a resistor 17, are respectively coupled between the column ports C1 to C4 and the ground Vss, with their gate electrodes connected to K1. NOR gate 19 has four inputs connected to the column ports respectively, with its output connected to one of the inputs of NAND gate 111.

The memory devices 2 comprises a plurality of latches, which are well known by those skilled in the art. Latches 20A to 20D are respectively connected to the row ports R1 to R4 and driven by clock S2, with their inverted output being connected to the row lines QR1 to QR4 which indicate the row in which a key is pressed. Latches 30A to 30D are respectively connected to the column ports C1 to C4 and driven by clock S4, with their non-inverted outputs being connected to the column lines QC1 to QC4 which indicate the column in which a key is pressed. Latch 10 is used to detect whether there is any key pressed down. The output of the NAND gate 111 is connected to the latch 10. The clock input of the latch 10 is connected to K2. If any key has been pressed in a scanning sequence, the output of the NAND gate 111 will go high, and it is stored in latch 10. The non-inverted output of the latch 10 is connected to AKD (any key down).

Extended line detectors 3 and 4 are both NOR gates. The inputs of the NOR gate 3 are connected to the outputs of latches 20A to 20D. The output of the NOR gate 3 is connected to QR5. Therefore, if no high level occurs on QR1 to QR4, the output of the NOR gate 3, i. e. QR5, will go high. The inputs of the NOR gate 4 are connected to the outputs of latches 30A to 30D. The output of the NOR gate 4 is connected to QC5. Therefore, if no high level occurs on QC1 to QC4, the output of the NOR gate 4, i. e. QC5, will go high.

At the beginning of a scan, clock S1 is at a high level and clock S3 is at a low level, so that K1 is low and K2 is high. PMOS transistors 12 and NMOS transistor 14 are on. PMOS transistors 13 and NMOS transistors 15 are off. Row ports R1 to R4 are set to high level with high impedance, and column ports C1 to C4 are set to low level with low impedance. If any key is pressed down, one of the row ports R1 to R4 will go to a low level, unless the key is in the Vcc row of FIG. 2a. When clock S2 is at a high level, the status of the row ports is stored into latches 20A to 20D. The particular row which goes low corresponds to the row in which the key is pressed, and the corresponding output, i. e. one of QR1 to QR4, will become high. If the key in the Vcc row is pressed, then QR1 to QR4 all stay low and QR5 goes to a high level.

When clock S3 is at a high level and clock S1 is at a low level, K1 will be high and K2 is low. Then PMOS transistors 12 and NMOS transistor 14 are off, and PMOS transistors 13 and NMOS transistors 15 are on. Row ports R1 to R4 are set to high level with low impedance, and column ports C1 to C4 are set to low level with high impedance. If the key is still pressed down, one of the column ports C1 to C4 will go to a high level, unless the key is in the Vss column. When clock S4 is at a high level, the status of the row ports is stored into latches 30A to 30D. The particular column which goes high corresponds to the column in which the key is pressed, and the corresponding output, i. e. one of QC1 to QC4, will become high. If the key in the Vss column is pressed, then QC1 to QC4 all stay low and QC5 goes to a high level.

As shown in FIG. 4, clocks S1 to S4 will repeatedly cause the circuit to scan the keyboard. If a key is pressed for a period of time, the state of the row and column ports will decode the position of the key on row lines QR1 to QR5 and column lines QC1 to QC5, where QR5 represents the keys on the Vcc line, and QC5 represents the keys on the Vss line. The row lines and column line corresponding to the pressed key will become high level, others will remain low level. AKD (any key down) line will become high if any key is pressed. It should be noted that logic gates 18, 19 and 111, and latch 10 can be omitted when AKD is not needed. It should also be noted that the scanning circuit 1 can be easily be modified to use NMOS transistors on row ports and PMOS transistors on column ports, by exchanging the PMOS transistors 12 and 13 with NMOS transistors 14 and 15, and exchanging K1 and K2 at the same time.

Figure 2B:
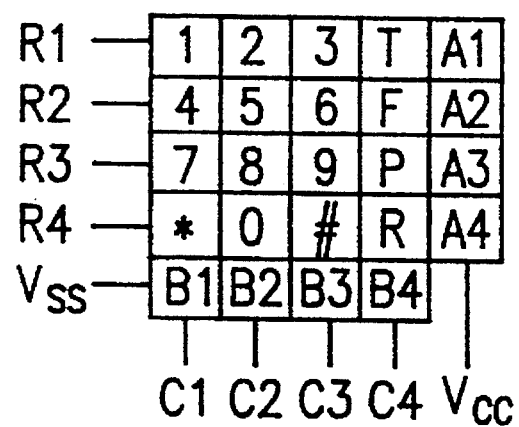
FIG. 2b is a schematic top view showing another embodiment of the extended matrix electrical keyboard according to the present invention.
Figure 5:
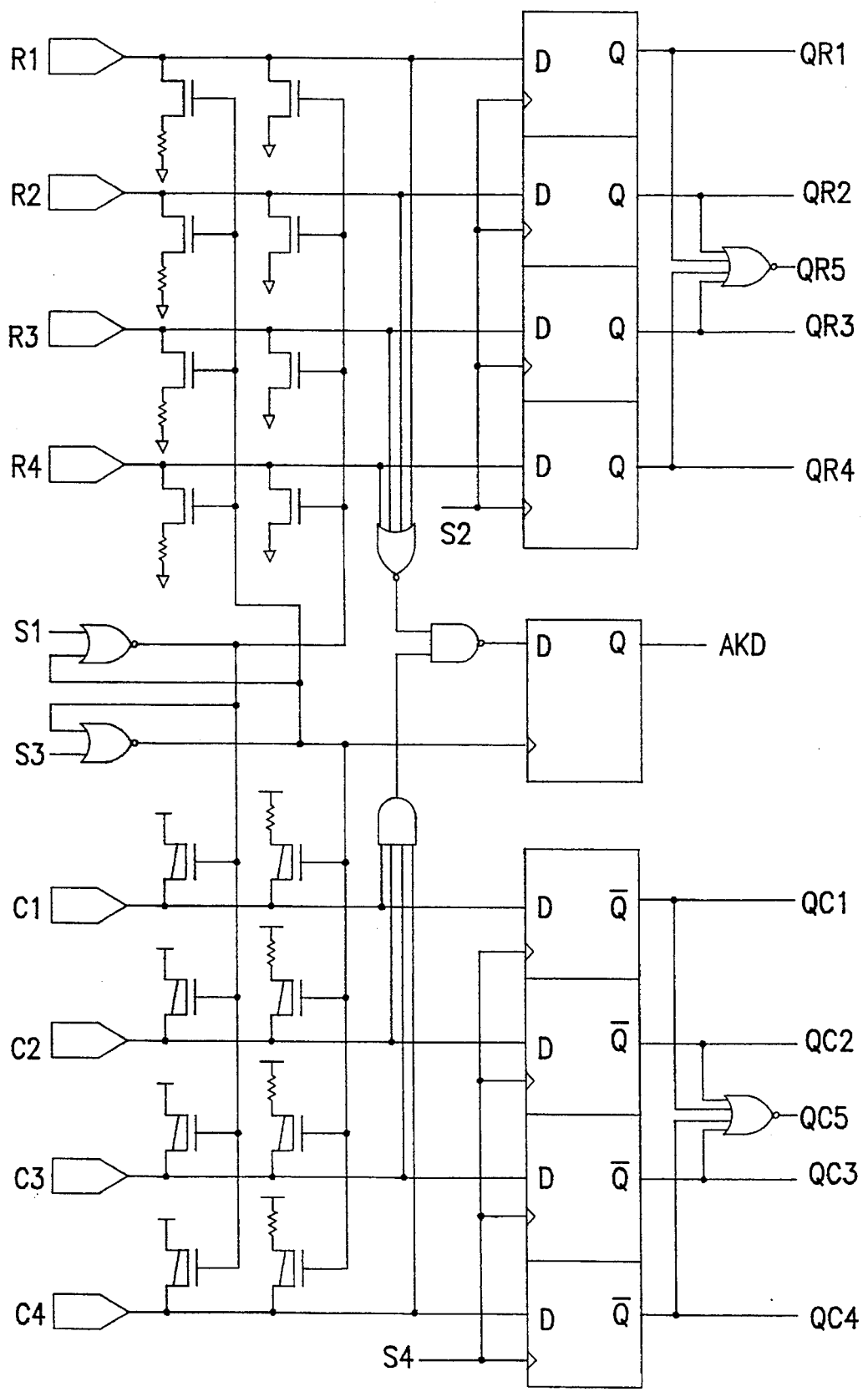
FIG. 5 is a schematic circuit diagram showing a second embodiment of the keyboard scanning circuit for incorporating with the keyboard shown in FIG. 2b according to the present invention.
Figure 6:
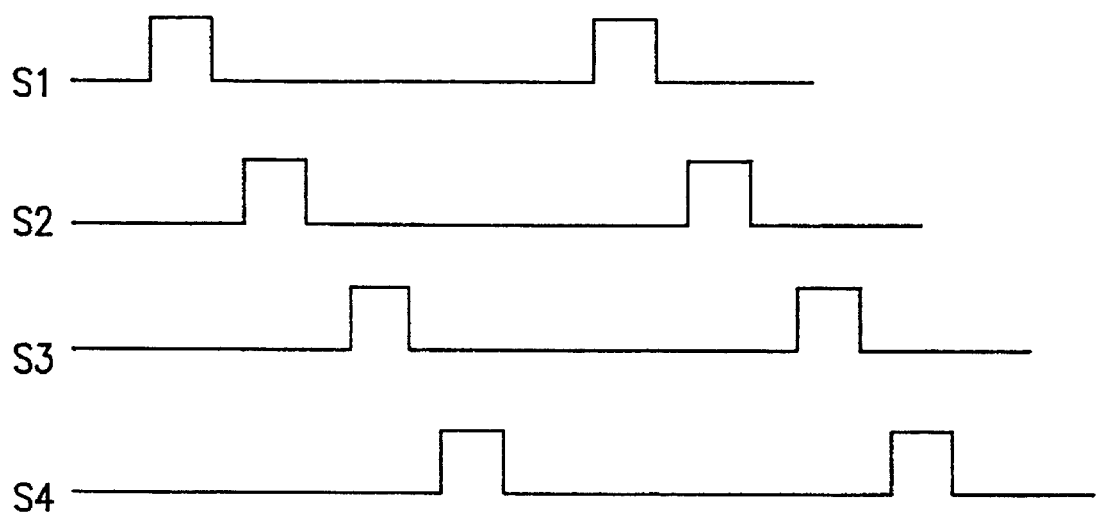
FIG. 6 shows a schematic diagram of a clock generated by a clock generator for keyboard scanning in the circuit shown in FIG. 5.

A second embodiment of the present invention is shown in FIG. 5. The circuit of the second embodiment is the same as that of the first embodiment, except that the row ports and column ports are exchanged. The second embodiment is used to incorporate with another extended keyboard shown in FIG. 2b. The extended keyboard shown in FIG. 2b is different from that shown in FIG. 2a only in that the voltage line Vcc and ground line Vss are exchanged. The circuit is controlled by control clocks S1, S2, S3 and S4 as shown in FIG. 6, which are same as the clocks shown in FIG. 4. The function of the circuit should now be readily apparent to those skilled in the art since it is so similar to that of the first embodiment.

While the invention has been described by way of an example and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A keyboard scanning circuit for an electric matrix keyboard having ordinary keys on the intersection of a first set of ports and a second set of ports, a first set of extended keys on the intersection of the first set of ports and a ground line, and a second set of extended keys on the intersection of the second set of ports and a voltage line, comprising:

a scanning circuit for scanning a status of the keys of the keyboard, including
a first set of resistors,
a first set of MOS transistors of a first type serially coupled with the first set of resistors between a voltage source and said first set of ports respectively,
a second set of MOS transistors of the first type coupled between the voltage source and said first set of ports respectively,
a second set of resistors,
a first set of MOS transistors of a second type serially coupled with the second set of resistors between a ground line and said second set of ports respectively,
a second set of MOS transistors of the second type coupled between the ground line and said second set of ports respectively, and
a flip-flop for driving the transistors to alternatively set said first set of ports to a high level with a high impedance and said second set of ports to a low level with a low impedance, or said first set of ports to a high level with a low impedance and said second set of ports to a low level with a high impedance;

a memory device for storing the status of the keys and outputting corresponding signals when one of said ordinary keys is pressed, including
a first set of latches connected to said first set of ports, having inverted outputs, and
a second set of latches connected to said second set of ports, having non-inverted outputs;

first logic means coupled to each of said inverted outputs for indicating when one of said first set of extended keys is depressed based upon each of said inverted outputs having a common logical state; and second logic means coupled to each of said non-inverted outputs for indicating when one of said second set of extended keys is depressed based upon each of said non-inverted outputs having a common logical state.

2. A keyboard scanning circuit as claimed in claim 1, further comprising:

an AND gate connected to all the first set of ports;
an additional NOR gate connected to all the second set of ports;
a NAND gate connected to the AND gate and the additional NOR gate; and
an additional latch connected to the NAND gate to output a corresponding signal when anyone of said keys is pressed.

3. A keyboard scanning circuit for an electric matrix keyboard having ordinary keys on the intersection of a first set of ports and a second set of ports, a first set of extended keys on the intersection of the first set of ports and a ground line, and a second set of extended keys on the intersection of the second set of ports and a voltage line, comprising:

a scanning circuit for scanning a status of the keys of the keyboard, including
a first set of high impedance MOS transistors of a first type coupled between a voltage source and said first set of ports respectively,
a second set of low impedance MOS transistors of the first type coupled between the voltage source and said second set of ports respectively,
a first set of high impedance MOS transistors of a second type coupled between a ground line and said second set of ports respectively,
a second set of low impedance MOS transistors of the second type coupled between the ground line and said second set of ports respectively, and
a flip-flop for driving the transistors to alternatively set said first set of ports to a high level with a high impedance and said second set of ports to a low level with a low impedance, or said first set of ports to a high level with a low impedance and said second set of ports to a low level with a high impedance; and a memory device for storing the status of the keys and outputting corresponding signals when one of said ordinary keys is pressed, including
a first set of latches connected to said first set of ports, having inverted outputs, and
a second set of latches connected to said second set of ports, having non-inverted outputs;

first logic means coupled to each of said inverted outputs for indicating when one of said first set of extended keys is depressed based upon each of said inverted outputs having a common logical state; and second logic means coupled to each of said non-inverted outputs for indicating when one of said second set of extended keys is depressed based upon each of said non-inverted outputs having a common logical state.

4. A keyboard scanning circuit as claimed in claim 3, further comprising:

an AND gate connected to all the first set of ports;
an additional NOR gate connected to all the second set of ports;
a NAND gate connected to the AND gate and the additional NOR gate; and
an additional latch connected to the NAND gate to output a corresponding signal when anyone of said keys is pressed.

5. A keyboard scanning circuit for scanning a matrix of keyboard switches connected between a first set of lines and a second set of lines, and additional keyboard switches located between at least one of said first and second sets of lines and a voltage line which is low-impedance coupled to at least one voltage source, said circuit comprising:

means for connecting said first set of lines to a low-impedance voltage source while at the same time coupling said second set of lines to a high-impedance voltage source to detect a closed keyboard switch in said matrix and a particular line of said second set to which said closed switch is connected during one scanning interval, means for connecting said second set of lines to a low-impedance voltage source while at the same time coupling said first set of lines to a high-impedance voltage source to detect said closed keyboard switch and a particular line of said first set to which said closed switch is connected during another scanning interval, memory means associated with said sets of lines for storing logical states occurring on said second lines during said one scanning interval and for storing logical states occurring on said first lines during said another scanning interval, and logic means coupled to outputs of said memory means for detecting when all of the outputs associated with at least one of said sets of lines are in a common logical state when a switch of said additional keyboard switches is closed.

* * * * *